United States Patent [19]

Andrews et al.

[11] 4,331,370
[45] May 25, 1982

[54] CONNECTION SYSTEM FOR PRINTED CIRCUIT BOARDS

[75] Inventors: Howard W. Andrews, Hershey; Robert F. Cobaugh, Elizabethtown, both of Pa.

[73] Assignee: AMP Incorporated, Harrisburg, Pa.

[21] Appl. No.: 144,706

[22] Filed: Apr. 28, 1980

[51] Int. Cl.$^3$ ............................................... H05K 1/00
[52] U.S. Cl. .................................................. 339/17 M
[58] Field of Search ................ 339/17 L, 17 M, 17 N, 339/17 LM, 17 LC, 143 R, 176 MP

[56] References Cited

U.S. PATENT DOCUMENTS

| | | | |
|---|---|---|---|
| 2,947,914 | 8/1960 | Simons | 339/17 M X |
| 4,054,345 | 10/1977 | Sherwood | 339/17 M |
| 4,215,910 | 8/1980 | Walter | 339/143 R |

FOREIGN PATENT DOCUMENTS 65268 1/1969 Fed. Rep. of Germany .... 339/17 L

Primary Examiner—John McQuade
Assistant Examiner—Frank H. McKenzie, Jr.
Attorney, Agent, or Firm—Allan B. Osborne

[57] ABSTRACT

The present invention relates to a system for providing input-output paths to and from a densely crowded multi-lager PCB (printed circuit board). More particularly the invention includes a pair of modules having a plurality of spaced conductive members extending normally therethrough and with the ends projecting laterally from opposing sides. The ends of the conductive members are inserted into plated through holes in the PCB on one side and into plated through holes on cards on the other sides. The cards have circuits extending from the plated through holes to an edge as does the PCB. The two cards and PCB are plugged into card-edge connectors as a unit. The connectors may be mounted on a mother board, back panel or the like.

2 Claims, 3 Drawing Figures

CONNECTION SYSTEM FOR PRINTED CIRCUIT BOARDS

BACKGROUND OF THE INVENTION

1. The Field of the Invention

The present invention relates to the art of increasing the number of input-output signal for a PCB.

2. The Prior Art

There is no known prior art directed to the invention disclosed herein.

SUMMARY OF THE PRESENT INVENTION

The present invention discloses a system for dramatically increasing the number of available input-output signal paths for a printed circuit board. A pair of modules having a plurality of conductive members extending through an insulative housing cooperate with a pair of cards so that each printed circuit board has in effect three edges adapted for being connected to card-edge connectors.

BRIEF DESCRIPTION OF THE ACCOMPANYING DRAWINGS

DESCRIPTION OF THE PRESENT INVENTION

Figure 1:
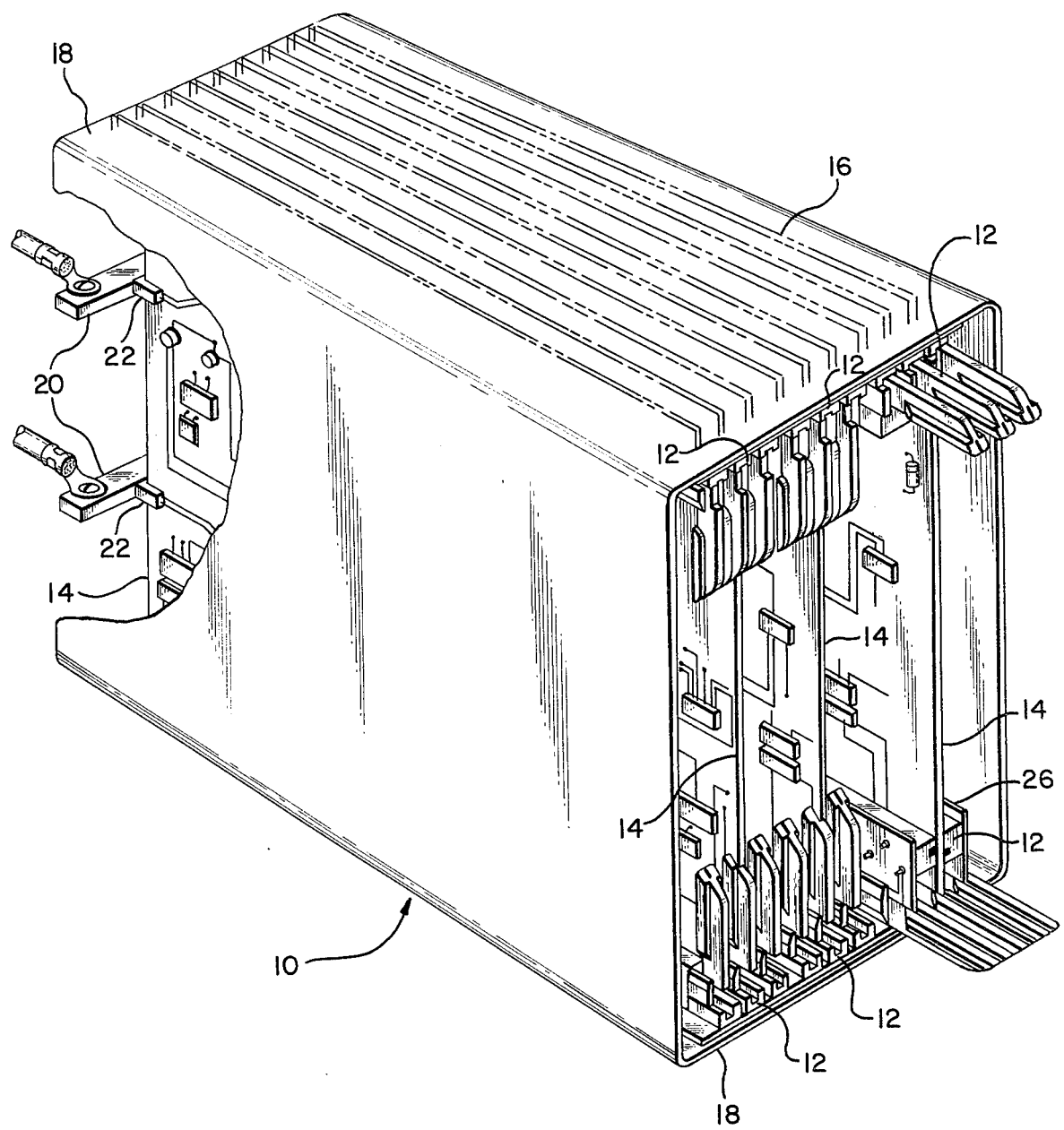
FIG. 1 is a perspective view of a card cage in which the present invention is employed to provide additional input-output signal paths to a high density packed PCB.

The card cage 10 shown in FIG. 1 contains six connection systems 12 of the present invention. The systems connect the circuitry on each of the three PCB 14 to other circuitry (not shown) via pins 16 projecting through the top and bottom surfaces 18 of the cage. The other circuitry may be on a mother board into which pins 16 will be inserted or the pins 16 may be of the type suitable for wire wrapping.

The back of the cage is broken away to illustrate one method by which power is provided. One or more buss bars 20 are plugged into power modules 22 positioned on and connected to each PCB 14. The bars extend across the back of the cage and may be fastened to the walls thereof if required.

Figure 2:
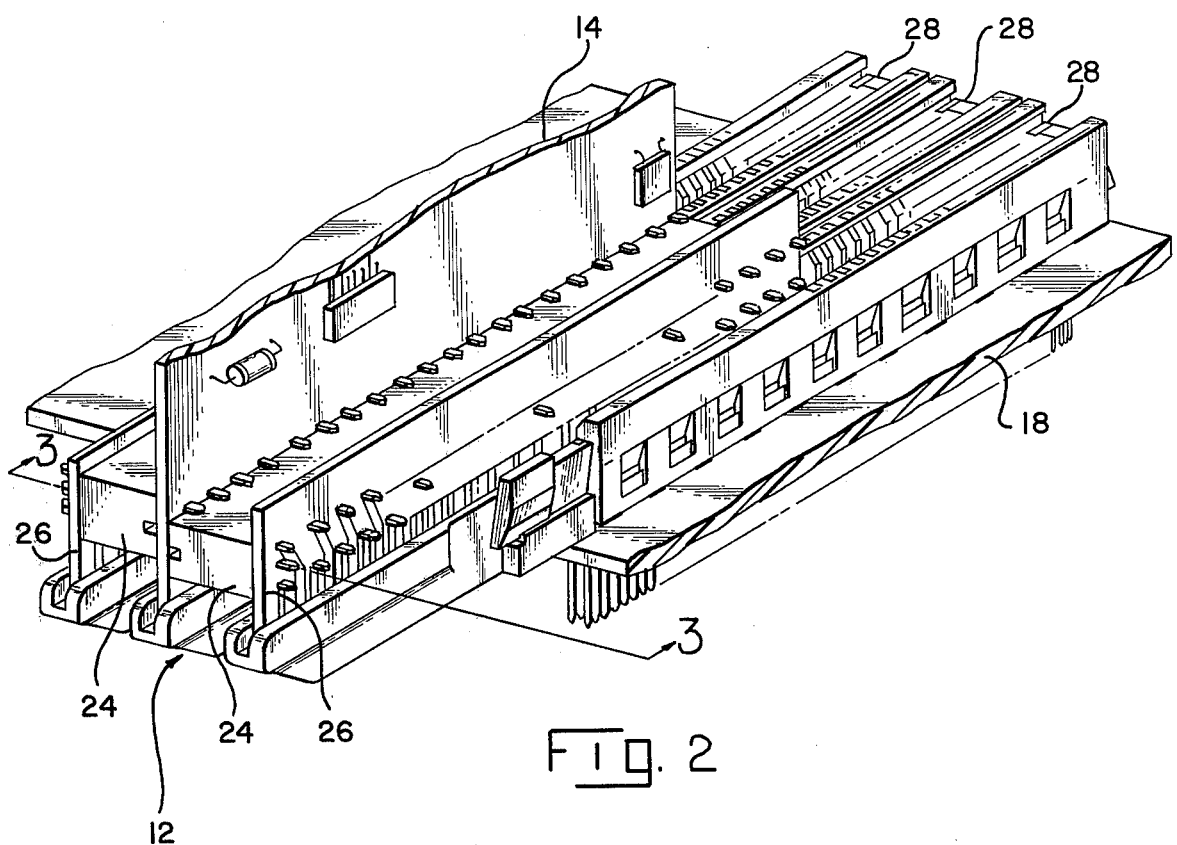
FIG. 2 is an enlarged view from FIG. 1 showing in greater detail the connector system of the present invention.

FIG. 2 shows one connection system 12. The system comprises a pair of modules 24, and two cards 26. Card edge connectors 28 and cage 10 complement the system but are not part of the invention.

Figure 3:
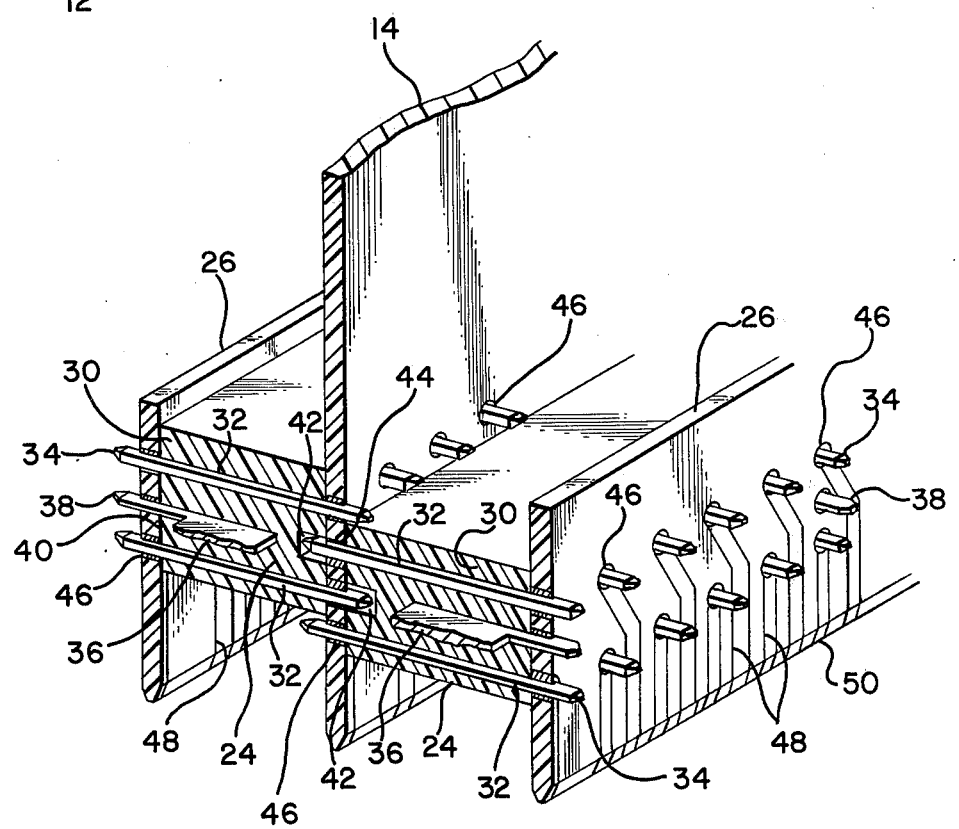
FIG. 3 is an elevational cross-sectional view taken along line 3—3 of FIG. 2.

FIG. 3 discloses the system in greater detail. The modules 24 include elongated housings 30 of insulating material such as VALOX, a glass-filled plastic sold by General Electric under that tradename. Two rows of elongated, conductive members 32 are embedded normally in the housing with the ends 34 projecting out from both sides. These members are preferably made from phosphor bronze. A narrow shield 36 is embedded in the housing between the two rows or rods. The shield, preferably made from copper, runs for the full length of the housing and is positioned inwardly from both sides. Pins 38, formed integrally with the shield at spaced intervals, extend from the shield to outside the housing along one side indicated by reference numeral 40. The housing also has a slot 42 on opposite side 44. The slot is located between the two rows of conductive member ends on that side.

Cards 26 are elongated printed circuit board cards of short height. Three rows of plated through holes 46 are provided along with conductive circuits 48 which extend from the holes to lower edge 50 of the card. As is well known in the art, PCB 14 also contains plated through holes 46 and conductive circuits 48.

The connection system of the present invention may be assembled by plugging the two modules into opposite sides of PCB 14. As shown in FIG. 3 one module is displaced vertically with respect to the other, the displacement being such that one row of ends 34, which extend through the board, are received in slot 42 in the module on the opposite side of the board. Obviously one module could be displaced far enough vertically to avoid the slot requirement; however as noted above, PCB 14 is densely packed and every bit of board space must be fully utilized.

Where ends 34 include a compliant section such as disclosed in U.S. Pat. No. 4,186,982, the insertion into plated through holes 46 provides both the required electrical connection and mechanical retention.

Cards 26 are plugged onto sides 40 on the two modules, with ends 34 and pins 38 entering the appropriate plated through holes in the cards. Obviously the cards can be attached to the modules before attaching the modules to the PCB.

The assembly as shown in FIG. 3 is duplicated on the other edge of PCB 14 to provide the system shown in FIG. 1.

Card edge connectors 28 shown in FIGS. 1 and 2 are ideally suitable for use with the system disclosed herein in that the card edges are slid in rather than top-loaded as required by other type card edge connectors. Connectors 28 are sold by AMP Incorporated of Harrisburg, Pennsylvania under the name of Zero Insertion Force Edge Connector-Lever Style.

The system disclosed herein provides a means for greatly increasing the number of input-output signal paths for a densely packed printed circuit board without increasing the board's size nor decreasing the board's circuitry. The system can also be used on just one edge of a printed circuit board. Further the system may be used on a printed circuit board that does not have an edge adapted for insertion into a card-edge connector. Further just one module and one card may be used on one side of a PCB if required.

It is to be understood that the forms of the invention shown and described herein are but preferred embodiments thereof and that various changes and modifications can be made therein without departing from the spirit or scope of the invention.

What is claimed is:

1. A connection system for providing input-output signal paths for a printed circuit board having plated through holes, comprising:
   a. a pair of cards having one edge adapted for termination in a card-edge connector, and further having three rows of plated through holes with circuits extending between the holes and the one edge; and
   b. a pair of modules formed from an insulative material and having two rows of spaced, conductive members embedded therein with the ends thereof projecting out of first and second opposing sides, and further having a shield of conductive material embedded in the insulative material between the two rows of conductive members with pins attached to the shield at spaced intervals and projecting out of a first of the two opposing sides, said pins and ends of the conductive members projecting out of the first opposing side being inserted into the three rows of plated through holes in the cards so that upon inserting the ends of the conductive members projecting out of the second opposing side of the modules into the plated through holes in a printed circuit board input-output signal paths are provided for said board to and from the one edges of the cards through said modules.

2. A connection system for providing input-output signal paths for a printed circuit board having plated through holes, comprising:

a. a card having one edge adapted for termination in a card-edge connector, and further having two rows of plated through holes with circuits extending between the holes and the one edge; and b. a module formed from an insulative material and having a row of spaced, conductive members embedded therein with the ends thereof projecting out of first and second opposing sides, and further having a shield of conductive material embedded in the insulative material adjacent the row of conductive members with pins attached to the shield at spaced intervals and projecting out of a first of the two opposing sides, said pins and ends of the conductive members projecting out of the first opposing side being inserted into the two rows of plated through holes in the card so that upon inserting the ends of the conductive members projecting out of the second opposing side of the modules into the plated through holes in a printed circuit board input-output signal paths are provided for said board to and from the edge of the card through said module.

* * * * *